(12) United States Patent
Kammuri

(10) Patent No.: US 9,549,471 B2
(45) Date of Patent: Jan. 17, 2017

(54) COPPER FOIL COMPOSITE

(75) Inventor: Kazuki Kammuri, Tokyo (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/579,073

(22) PCT Filed: Jun. 16, 2011

(86) PCT No.: PCT/JP2011/063770
§ 371 (c)(1),
(2), (4) Date: Oct. 16, 2012

(87) PCT Pub. No.: WO2012/008260
PCT Pub. Date: Jan. 19, 2012

(65) Prior Publication Data
US 2013/0071676 A1    Mar. 21, 2013

(30) Foreign Application Priority Data

Jul. 15, 2010    (JP) .................. 2010-161029

(51) Int. Cl.
H05K 1/03    (2006.01)
H05K 3/02    (2006.01)
(Continued)

(52) U.S. Cl.
CPC .............. *H05K 3/022* (2013.01); *B32B 15/08* (2013.01); *B32B 15/085* (2013.01); *B32B 15/09* (2013.01);
(Continued)

(58) Field of Classification Search
CPC ............. Y10T 428/31678; B32B 15/08; B32B 15/085; B32B 15/09; B32B 15/20; B32B 2457/08; H01K 3/022; H01K 1/0393; H01K 2201/0145; H01K 2201/0154; H01K 2201/0358
See application file for complete search history.

(56) References Cited

U.S. PATENT DOCUMENTS 4,250,375 A    2/1981    Tsutsumi et al.
4,522,880 A    6/1985    Klostermeier et al.
(Continued)

FOREIGN PATENT DOCUMENTS

EP    0691389    1/1996
EP    2 100 987    9/2009
(Continued)

OTHER PUBLICATIONS

International Search Report corresponding to International Patent Application No. PCT/JP2011/063770 dated Aug. 23, 2011.
(Continued)

*Primary Examiner* — Kevin R Kruer
(74) *Attorney, Agent, or Firm* — Jenkins, Wilson, Taylor & Hunt, P.A.

(57) ABSTRACT

A copper foil composite comprising a copper foil and a resin layer laminated thereon, wherein equation 1: $(f_3 \times t_3)/(f_2 \times t_2) => 1$ is satisfied when $t_2$ (mm) is a thickness of the copper foil, $f_2$ (MPa) is a stress of the copper foil under tensile strain of 4%, $t_3$ (mm) is a thickness of the resin layer, $f_3$ (MPa) is a stress of the resin layer under tensile strain of 4%, and equation 2: $1 <= 33 f_1/(F \times T)$ is satisfied when $f_1$ (N/mm) is 180° peeling strength between the copper foil and the resin layer, F (MPa) is strength of the copper foil composite under tensile strain of 30%, and T (mm) is a thickness of the copper foil composite.

8 Claims, 1 Drawing Sheet

(51) Int. Cl.
   *B32B 15/08* (2006.01)
   *B32B 15/085* (2006.01)
   *B32B 15/09* (2006.01)
   *B32B 15/20* (2006.01)

(52) U.S. Cl.
   CPC ............ *B32B 15/20* (2013.01); *B32B 2457/08* (2013.01); *H05K 1/0393* (2013.01); *H05K 2201/0145* (2013.01); *H05K 2201/0154* (2013.01); *H05K 2201/0358* (2013.01); *Y10T 428/31678* (2015.04)

(56) References Cited

U.S. PATENT DOCUMENTS

| | | | |
|---|---|---|---|
| 4,675,246 A | 6/1987 | Kundinger et al. | |
| 4,749,625 A | 6/1988 | Obayashi et al. | |
| 4,965,408 A | 10/1990 | Chapman et al. | |
| 5,573,857 A | 11/1996 | Auger | |
| 5,645,921 A | 7/1997 | Matsunaga et al. | |
| 6,143,399 A * | 11/2000 | Kohno | B32B 15/08 257/E21.514 |
| 6,217,996 B1 * | 4/2001 | Yamamoto | B32B 15/08 428/220 |
| 6,251,507 B1 | 6/2001 | Yamamoto et al. | |
| 6,548,180 B2 * | 4/2003 | Yamamoto | B32B 15/08 428/213 |
| 6,808,825 B2 * | 10/2004 | Nagai | C22C 9/00 428/332 |
| 6,835,442 B2 | 12/2004 | Kudo et al. | |
| 7,308,752 B2 | 12/2007 | Tanaka | |
| 8,053,082 B2 * | 11/2011 | Hashimoto | B32B 15/08 427/385.5 |
| 9,079,378 B2 | 7/2015 | Kammuri | |
| 2002/0155021 A1 | 10/2002 | Nagai et al. | |
| 2003/0132192 A1 | 7/2003 | Kudo et al. | |
| 2004/0074655 A1 | 4/2004 | Takahashi et al. | |
| 2004/0094512 A1 | 5/2004 | Ono et al. | |
| 2008/0099110 A1 | 5/2008 | Muroga et al. | |
| 2009/0142607 A1 | 6/2009 | Narui et al. | |
| 2010/0269959 A1 | 10/2010 | Gao et al. | |
| 2011/0005812 A1 * | 1/2011 | Shimokawa | B32B 27/34 174/255 |
| 2011/0189501 A1 | 8/2011 | Fujisawa et al. | |
| 2012/0090887 A1 | 4/2012 | Kanmuri | |
| 2012/0141809 A1 | 6/2012 | Kanmuri | |
| 2013/0056258 A1 | 3/2013 | Zhang et al. | |
| 2013/0206471 A1 | 8/2013 | Kammuri | |
| 2014/0113121 A1 | 4/2014 | Kammuri | |
| 2014/0162084 A1 | 6/2014 | Kammuri | |
| 2015/0064493 A1 | 3/2015 | Tanaka et al. | |
| 2015/0111059 A1 | 4/2015 | Tanaka et al. | |

FOREIGN PATENT DOCUMENTS

| | | |
|---|---|---|
| EP | 2 295 489 | 3/2011 |
| EP | 2 679 384 | 5/2015 |
| JP | 59-162044 | 9/1984 |
| JP | 1-163059 | 6/1989 |
| JP | 2-097097 | 4/1990 |
| JP | H03-112643 | 5/1991 |
| JP | 04-144187 | 5/1992 |
| JP | 04-223006 | 8/1992 |
| JP | HEI7-003237 | 1/1995 |
| JP | 07-058477 | 3/1995 |
| JP | A H7-101007 | 4/1995 |
| JP | HEI 07-032307 | 4/1995 |
| JP | HEI 07-290449 | 11/1995 |
| JP | 1997-053162 | 2/1997 |
| JP | 09-270593 | 10/1997 |
| JP | 10-056289 | 2/1998 |
| JP | H10-058593 | 3/1998 |
| JP | 10-173385 | 6/1998 |
| JP | H11-40980 | 2/1999 |
| JP | 3009383 | 2/2000 |
| JP | 2000-101004 | 4/2000 |
| JP | 2000-182623 | 6/2000 |
| JP | 2000-212661 | 8/2000 |
| JP | 2001-011684 | 1/2001 |
| JP | 2002-019023 | 1/2002 |
| JP | 2002-144510 | 5/2002 |
| JP | 2002-217507 | 8/2002 |
| JP | 2002-249835 | 9/2002 |
| JP | 2002-319319 | 10/2002 |
| JP | 2003-096526 | 4/2003 |
| JP | 2003-193211 | 7/2003 |
| JP | 2004-060018 | 2/2004 |
| JP | 2004-256832 | 9/2004 |
| JP | 2004-360029 | 12/2004 |
| JP | 2005-004826 | 1/2005 |
| JP | 2005-015861 | 1/2005 |
| JP | 2005-068484 | 3/2005 |
| JP | 2005-191443 | 7/2005 |
| JP | 2005-248221 | 9/2005 |
| JP | 2005-344207 | 12/2005 |
| JP | 2006-240073 | 9/2006 |
| JP | 2006-272743 | 10/2006 |
| JP | 2006-324546 | 11/2006 |
| JP | 2006-326684 | 12/2006 |
| JP | 2007-110010 | 4/2007 |
| JP | 2007-146258 | 6/2007 |
| JP | 2007-207812 | 8/2007 |
| JP | 8-53789 | 3/2008 |
| JP | 2008-088492 | 4/2008 |
| JP | 2008-120081 | 5/2008 |
| JP | 2008-166655 | 7/2008 |
| JP | 2009-108376 | 5/2009 |
| JP | 2009-111203 | 5/2009 |
| JP | 2009-161068 | 7/2009 |
| JP | 2010-006071 | 1/2010 |
| JP | 2010-37654 | 2/2010 |
| JP | 2010-100887 | 5/2010 |
| JP | 2010-194759 | 9/2010 |
| JP | 2011-20264 | 2/2011 |
| JP | 5127086 | 1/2013 |
| RU | 2138932 | 9/1999 |
| RU | 2303320 | 7/2007 |
| RU | 2574461 | 2/2016 |
| SU | 994306 | 2/1983 |
| WO | WO 97/04627 | 2/1997 |
| WO | WO2004/016060 | 2/2004 |
| WO | WO 2004/035303 | 4/2004 |
| WO | WO 2008/050584 | 5/2008 |
| WO | WO 2009/144973 | 12/2009 |
| WO | WO 2010/113343 | 10/2010 |
| WO | WO2011/004664 | 1/2011 |
| WO | WO2011/121801 | 10/2011 |
| WO | WO2012/008260 | 1/2012 |
| WO | WO 2012/132814 | 10/2012 |
| WO | WO 2012/157469 | 11/2012 |
| WO | WO 2013/105265 | 7/2013 |
| WO | WO 2013/105266 | 7/2013 |

OTHER PUBLICATIONS

Japanese Industrial Standard JIS Z 2241, "Metallic materials—Tensile testing—Method of test at room temperature," Japanese Standards Association (2011).

International Preliminary Report on Patentability corresponding to International Application No. PCT/JP2009/067886 dated Nov. 15, 2011.

International Search Report corresponding to International Application No. PCT/JP2009/067886 dated Nov. 30, 2009.

International Search Report corresponding to International Patent Application No. PCT/JP2010/059416 dated Aug. 3, 2010.

Notification of Transmittal of Translation of the International Preliminary Report on Patentabiltiy corresponding to International Patent Application No. PCT/JP2010/059416 dated Feb. 23, 2012.

Official Action corresponding to U.S. Appl. No. 13/254,385 dated May 23, 2013.

Supplementary European Search Report corresponding to European Patent Application No. 09 842 694.3—1303 / 2416639 dated Mar. 21, 2013.

(56) References Cited

OTHER PUBLICATIONS

Supplementary European Search Report corresponding to European Patent Application No. 10 796 975.0—1303 / 2439063 dated Apr. 4, 2013.
Notification of Transmittal of Translation of the International Preliminary Report on Patentability (Chapter I or Chapter II of the Patent Cooperation Treaty) corresponding to International Patent Application No. PCT/JP2011/063770 dated Feb. 21 2013.
Autograph AGS-X Series Precision Universal Tester, Shamadzu Corporation, marketing material printed from web site www.shimadzu.com on Mar. 22, 2014.
MCXS Photovoltaic CVD, Shamadzu Corporation, marketing material printed from web site www.shimadzu.com on Mar. 24, 2014.
Trapezium Lite X data processing reference manual, No. 349-05245A, pp. 1, and 45-46.
Trapezium Lite X, Shamadzu Corporation, marketing material printed from web site www.shimadzu.com on Mar. 22, 2014.
Japanese Industrial Standard JIS Z2241, "Method of tensile test for metallic materials," Japanese Standards Association (1998).
Japanese Industrial Standard C5016, "Test Methods for flexible printed wiring boards," Japanese Standards Association (1994).
Supplementary European Search Report corresponding to European Patent Application No. 11806591.1-1803 / 2581220 dated Apr. 15, 2014.
Advisory Action corresponding to U.S. Appl. No. 13/254,385 dated Jun. 27, 2014.
Asaharu, N., "Member and Metho for Electromagnetically Shielding Electric Wires, or the like". Jun. 26, 1998, (JP10-173385 A), [Drawings], <http://www4.ipdl.inpit.go.jp/Tokujitu/PAJdetail.ipdl?N0000=60&N0120=01 &N2001=2&N3001=H10-173385>.
Asaharu, N., "Member and Metho for Electromagnetically Shielding Electric Wires, or the like". Jun. 26, 1998, (JP10-173385 A), [Translation of—Detailed Description], <http://www4.ipdl.inpit.go.jp/Tokujitu/PAJdetail.ipdl?N0000=60&N0120=01 &N2001=2& N3001=H10-173385>.
Japanese Industrial Standard JIS K 7127, "Plastics—Determination of tensile properties—Part 3: Test conditions for films and sheets," Japanese Standards Association (1999) (Translation).
Japanese Industrial Standard JIS Z2201, "Test piece for tensile test for metallic materials," Japanese Standards Association (1998) (Translation).
Official Action corresponding to European Patent Application No. 11806591.1-1803 dated May 2, 2014.
Official Action corresponding to U.S. Appl. No. 13/254,385 dated Mar. 14, 2014.
Official Action corresponding to U.S. Appl. No. 13/254,385 dated Sep. 11, 2014.
Official Action corresponding to U.S. Appl. No. 13/382,360 dated Jul. 17, 2014.
Advisory Action corresponding to U.S. Appl. No. 13/382,360 dated Mar. 11, 2015.
Extended European Search Report corresponding to Application No. 12786287.8-1303 dated Oct. 16, 2014.
International Search Report corresponding to International Patent Application No. PCT/JP2010/058975 dated Aug. 31, 2010 (Translation).
International Search Report corresponding to International Patent Application No. PCT/JP2012/050590 dated Apr. 17, 2012. (Translation).
International Search Report corresponding to International Patent Application No. PCT/JP2012/050591 dated Apr. 17, 2012. (Translation).
International Search Report corresponding to International Patent Application No. PCT/JP2012/055933 dated May 22, 2012. (Translation).
International Search Report corresponding to International Patent Application No. PCT/JP2012/061761 dated Jul. 10, 2012. (Translation).

Interview Summary corresponding to U.S. Appl. No. 13/254,385 dated Dec. 16, 2014.
Japanese Industrial Standard C2151, "Testing methods of plastic films for electrical purposes," (2006).
Japanese Industrial Standard JIS C2531.
Japanese Industrial Standard JIS G3141.
Japanese Industrial Standard JIS H 3110.
Japanese Industrial Standard JIS H 4000.
Japanese Industrial Standard JIS H4551.
Japanese Industrial Standard JIS Z 2248.
Japanese Industrial Standard JIS-H0501.
Japanese Industrial Standard JIS-H3100.
Japanese Industrial Standard JIS-H3250.
Japanese Industrial Standard JIS-H3510.
Notice of Allowance corresponding to U.S. Appl. No. 13/254,385 dated Apr. 6, 2015.
Notice of Grant corresponding to Russian Patent Application No. 2014128572 dated Aug. 19, 2015.
Notification of Transmittal of Translation of the International Preliminary Report on Patentability (Chapter I of the Patent Cooperation Treaty) corresponding to International Patent Application No. PCT/JP2012/055933 dated Oct. 8, 2013.
Notification of Transmittal of Translation of the International Preliminary Report on Patentability (Chapter I or Chapter II of the Patent Cooperation Treaty) corresponding to International Patent Application No. PCT/JP2012/050590 dated Jul. 24, 2014.
Notification of Transmittal of Translation of the International Preliminary Report on Patentability (Chapter I or Chapter II of the Patent Cooperation Treaty) corresponding to International Patent Application No. PCT/JP2012/050591 dated Jul. 24, 2014.
Notification of Transmittal of Translation of the International Preliminary Report on Patentability (Chapter I or Chapter II of the Patent Cooperation Treaty) corresponding to International Patent Application No. PCT/JP2012/061761 dated Nov. 19, 2013.
Notification of Transmittal of Translation of the International Preliminary Report on Patentability corresponding to International Patent Application No. PCT/JP2010/058975 dated Dec. 13, 2012.
Official Action corresponding to U.S. Appl. No. 13/382,360 dated Dec. 12, 2014.
Official Action corresponding to U.S. Appl. No. 13/520,087 dated Jun. 30, 2015.
Restriction Requirement corresponding to U.S. Appl. No. 14/006,242 dated Nov. 16, 2015.
Supplementary European Search Report corresponding to European Patent Application No. 10848975.8-1803 dated Oct. 13, 2014.
Supplementary European Search Report corresponding to European Patent Application No. 12763155.4-1308 dated Jul. 10, 2014.
Supplementary European Search Report corresponding to European Patent Application No. 12865468.8-1803 dated Jul. 16, 2015.
Supplementary European Search Report corrsponding to European Patent Application No. 12865150.2-1303 dated Aug. 14, 2015.
Translation of table 1 of JPA2002-19023("Kawazu").
Arruda et al, "Effects of strain rate, temperature and thermomechanical coupling on the finite strain deformation of glassy polymers", Mechanics of Materials 19 (1995) pp. 193-212.
BASF Corporation, "Tensile Properties of Semi-Crystalline Thermoplastics-Performance Comparison under Alternative Testing Standard", Paper No. 2000-01-1319, 2003.
English translation of Decision to Grant Russian Patent Application No. 2014128526 dated Oct. 29, 2015.
"Materials Data Book", Cambridge University Engineering Department, p. 11 (2003).
Official Action corresponding to U.S. Appl. No. 13/520,087 dated Jan. 7, 2016.
Official Action corresponding to U.S. Appl. No. 13/382,360 dated Jan. 12, 2016.
Office Action corresponding to U.S. Appl. No. 14/006,242 dated Jul. 28, 2016.
Proszynski et al, "Measurement of stress as a function of temperature in Ag and Cu thin films", Optica Applicata, vol. XXXV, No. 3, 2005, pp. 517-522.
Interview Summary corresponding to U.S. Appl. No. 13/520,087 dated Mar. 15, 2016.

(56) References Cited

OTHER PUBLICATIONS

Official Action corresponding to U.S. Appl. No. 14/006,242 dated Feb. 11, 2016.
Official Action corresponding to U.S. Appl. No. 14/115,803 dated Apr. 14, 2016.
"Beam Deflection Formulae"—<http://www.advancepipeliner.com/resources/others/beams/beam_deflection_formulae.pdf>.
Official Action corresponding to U.S. Appl. No. 13/254,385 dated Sep. 5, 2013.

* cited by examiner

COPPER FOIL COMPOSITE

RELATED APPLICATIONS

This application is a national stage application of International Application No. PCT/JP2011/063770, filed Jun. 16, 2011, which claims the benefit of Japanese Patent Application No. 2010-161029, filed Jul. 15, 2010.

FIELD OF THE INVENTION

The present invention relates to a copper foil composite comprising a copper foil and a resin layer laminated thereon.

DESCRIPTION OF THE RELATED ART

A copper foil composite comprising a copper foil and a resin layer laminated thereon is applied to a flexible printed circuit (FPC), an electromagnetic shielding material, an RF-ID (wireless IC tag), a sheet heating element, a heat sinks and the like. As an example of the FPC, a copper foil circuit is formed on a base resin layer, and a coverlay film for protecting the circuit overlaps the circuit to provide a laminate structure having a resin layer/copper foil/resin layer.

For formability of such a copper foil composite, folding performance as represented by MIT flexibility and high cycle flexibility as represented by IPC flexibility are needed. A copper foil composite having excellent folding performance and flexibility is suggested (see Patent Literatures 1 to 3). As an example, FPC is bent and used at a movable part such as a hinge part of a mobile phone; or for space-saving of a circuit. Its deformation mode is a uniaxial flex as represented by the above-described MIT flexibility test and IPC flexibility test. Thus, FPC is designed not for a severe deformation mode.

PRIOR ART LITERATURE

Patent Literature

[Patent Literature 1] Japanese Unexamined Patent Publication No. 2010-100887
[Patent Literature 2] Japanese Unexamined Patent Publication No. 2009-111203
[Patent Literature 3] Japanese Unexamined Patent Publication No. 2007-207812

SUMMARY OF THE INVENTION

Problems to be Solved by the Invention

However, once the above-described copper foil composite is press-formed, it induces a severe (complex) deformation mode, which differs from that in the MIT flexibility test or the IPC flexibility test. So, it might cause a problem that the copper foil is broken. And now, if the copper foil composite can be press-formed, a structure including a circuit can be tailored to fit a product shape.

Accordingly, an object of the present invention is to provide a copper foil composite having excellent formability while preventing a copper foil from broken, even if a severe (complex) deformation, which is different from a uniaxial flex, is induced by press forming and the like.

Means for Solving the Problems

The present inventors found that when the deformation behavior of the resin layer is transmitted to the copper foil, and the copper foil is deformed together with the resin layer, the local necking of the copper foil is hardly occurred, the ductility is increased and the crack of the copper foil is prevented. Thus, the present invention is attained. In other words, the properties of the resin layer and the copper foil are specified so that the deformation behavior of the resin layer is transmitted to the copper foil.

That is, the present invention provides a copper foil composite comprising a copper foil and a resin layer laminated thereon, wherein equation 1: $(f_3 \times t_3)/(f_2 \times t_2) \geq 1$ is satisfied when $t_2$ (mm) is a thickness of the copper foil, $f_2$ (MPa) is a stress of the copper foil under tensile strain of 4%, $t_3$ (mm) is a thickness of the resin layer, $f_3$ (MPa) is a stress of the resin layer under tensile strain of 4%, and equation 2: $1 \leq 33 f_1/(F \times T)$ is satisfied when $f_1$ (N/mm) is 180° peeling strength between the copper foil and the resin layer, F (MPa) is strength of the copper foil composite under tensile strain of 30%, and T (mm) is a thickness of the copper foil composite.

Preferably, the equations 1 and 2 are true at the temperature lower than the glass transition temperature of the resin layer.

Preferably, a ratio I/L of tensile breaking strain I of the copper foil composite to tensile breaking strain L of the resin layer alone is 0.7 to 1.

Effect of the Invention

According to the present invention, there is provided a copper foil composite having excellent formability while preventing a copper foil from broken even if a severe (complex) deformation, which is different from a uniaxial flex, is induced by press forming and the like.

DETAILED DESCRIPTION OF THE INVENTION

Figure 1:
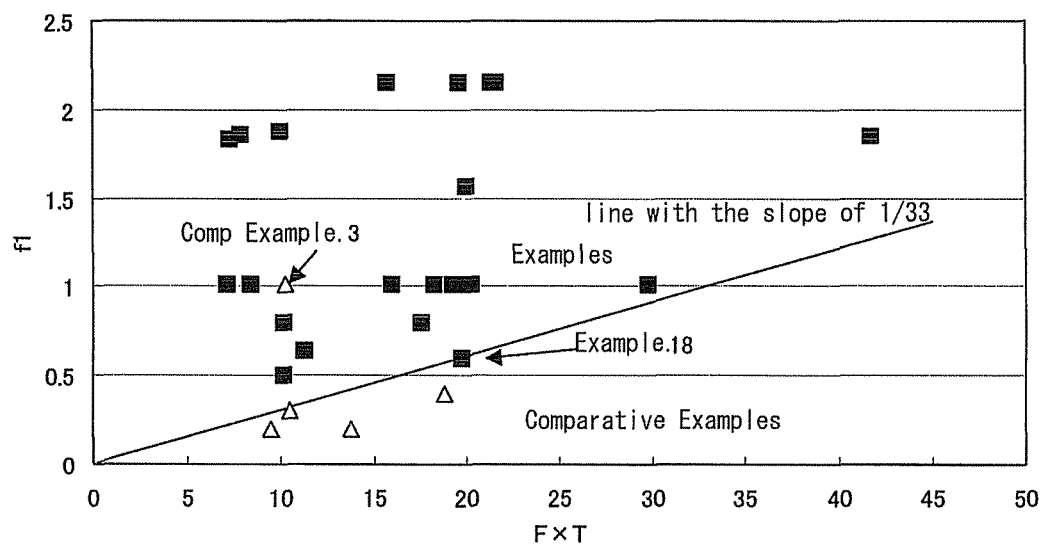
FIG. 1 is a graph showing a relationship between $f_1$ and (F×T) obtained by experiments.

The copper foil composite of the present invention comprises a copper foil and a resin layer laminated thereon. The usage of the copper foil composite of the present invention includes a flexible printed circuit (FPC), an electromagnetic shielding material, an RF-ID (wireless IC tag), a sheet heating element, a heat sink, but not limited to these examples.

<Copper Foil>

The thickness $t_2$ of the copper foil is preferably 0.004 to 0.05 mm (4 to 50 μm). When the $t_2$ is less than 0.004 mm (4 μm), the ductility of the copper foil is significantly decreased, and the formability of the copper foil composite may not be improved. It is preferred that the tensile breaking strain of the copper foil be 4% or more. When the $t_2$ exceeds 0.05 mm (50 μm), the properties belonging to the copper foil itself significantly appear on the copper foil composite, and the formability of the copper foil composite may not be improved.

As the copper foil, a rolled copper foil, an electrolytic copper foil, a metallized copper foil and the like can be used. The rolled copper foil is preferable; since it has excellent formability based on recrystallization and has decreased strength ($f_2$). It is contemplated that the copper foil includes a treated layer formed on the surface of the copper foil in order to provide bonding properties and rust prevention.

<Resin Layer>

The resin layer is not especially limited. The resin layer may be formed by applying a resin material to the copper foil. The resin film which can be bonded to the copper foil is preferable. Examples of the resin film include a polyethylene terephthalate (PET) film, a polyethylene naphthalate (PEN) film, a polyimide (PI) film, a liquid crystal polymer (LCP) film and a polypropylene (PP) film.

The resin film may be laminated on the copper foil by using an adhesive agent between the resin film and the copper foil, or by thermally compressing the resin film and the copper foil. When the strength of the adhesive agent layer is low, the formability of the copper foil composite is difficult to be improved. It is therefore preferred that the strength of the adhesive agent layer be ⅓ or more of the stress ($f_3$) of the resin layer. Since the technical thought of the present invention is to improve the ductility by transmitting the deformation behavior of the resin layer to the copper foil, and deforming the copper foil similar to the resin layer, and then preventing the necking of the copper foil. Therefore, the adhesive agent layer may not be well deformed when the strength of the adhesive agent layer is low, and the behavior of the resin is not transmitted to the copper foil.

When the adhesive agent layer is used, the properties of the adhesive agent layer are involved in those of the resin layer, as described later.

The thickness $t_3$ of the resin layer is preferably 0.012 to 0.12 mm (12 to 120 μm). When the $t_3$ is less than 0.012 mm (12 μm), $(f_3 \times t_3)/(f_2 \times t_2)$ may be <1. When the $t_3$ exceeds 0.12 mm (120 μm), the flexibility of the resin layer is decreased, the stiffness becomes too high, and the formability is degraded. It is preferred that the tensile breaking strain of the resin layer be 40% or more.

<Copper Foil Composite>

The combination of the copper foil composite comprising the copper foil and the resin layer laminated thereon described above includes a two-layer structure such as copper foil/resin layer or a three-layer structure such as resin layer/copper foil/resin layer or copper foil/resin layer/copper foil. In case of the (resin layer/copper foil/resin layer) where the resin layers are disposed on both sides of the copper foil, the total value of $(f_3 \times t_3)$ is obtained by adding each value of $(f_3 \times t_3)$ calculated about the two resin layers. In case of the (copper foil/resin layer/copper foil) where the copper foils are disposed on both sides of the resin layer, the total value of $(f_2 \times t_2)$ is obtained by adding each value of $(f_2 \times t_2)$ calculated about the two copper foils.

<180° Peeling Strength>

Since the copper foil is thin, necking is easily occurred in a thickness direction. When the necking is produced, the copper foil is broken and the ductility is therefore decreased. On the other hand, the resin layer has a property that the necking is difficult to be produced when tension is applied (i.e., the resin layer has a wide area with uniform strain). Thus, in the composite comprising the copper foil and the resin layer, when the deformation behavior of the resin layer is transmitted to the copper foil, and the copper foil is deformed together with the resin layer, the necking of the copper foil is hardly occurred, and the ductility is increased. When the adhesion strength between the copper foil and the resin layer is low, the deformation behavior of the resin layer cannot be transmitted to the copper foil, so the ductility is not improved (the copper foil is peeled and cracked).

Then, high adhesion strength is needed. A direct indicator of the adhesion strength is shear bond strength. If the adhesion strength is increased such that a level of the shear bond strength is similar to that of the copper foil composite, the area other than the bonding surface is broken to make a measurement difficult.

In view of the above, the value $f_1$ of 180° peeling strength is used. Although the absolute values of the shear bond strength and the 180° peeling strength are totally different, there is a correlation between the formability, tensile elongation and the 180° peeling strength. So, the 180° peeling strength is deemed as an indicator of the adhesion strength.

In fact, it is considered that "the strength at the time of the material is broken" is equal to "the shear bond strength." As an example, it is considered that when 30% or more of the tensile strain is required, "30% of a flow stress≤shear bond strength." When 50% or more of the tensile strain is required, "50% of a flow stress≤shear bond strength." According to the experiments by the present inventors, the formability was excellent when the tensile strain exceeded 30% or more. So, the strength obtained when the tensile strain is 30% is defined as the strength F of the copper foil composite, as described later.

FIG. 1 is a graph showing a relationship between $f_1$ and (F×T) obtained by experiments, and plots the value of $f_1$ and (F×T) in each Example and Comparative Example. (F×T) is the strength of the copper foil composite under tensile strain of 30%, and if this is regarded as the minimum shear bond strength required for increasing the formability, $f_1$ and (F×T) are correlated at the slope of 1 as long as the absolute values of these are same.

However, in FIG. 1, the values of $f_1$ and (F×T) in all data are not correlated similarly. In each Comparative Example with poor formability, the coefficient of correlation $f_1$ to (F×T) (in other words, the slope of $f_1$ to (F×T) from the origin point in FIG. 1) is gentle, and the 180° peeling strength is correspondingly poor. On the other hand, the slope of each Example is greater than that of each Comparative Example. The slope of Example 18 (just broken under the strain of 30%) is gentlest and is 1/33. Thus, this value is regarded as the correlation function between the minimum shear bond strength and the 180° peeling strength for increasing the formability. In other words, it is considered that the shear bond strength is 33 times greater than the 180° peeling strength.

In Comparative Example 3, the slope in FIG. 1 exceeds 1/33. However, equation 1: $(f_3 \times t_3)/(f_2 \times t_2)$ described later is less than 1, which results in the poor formability.

The 180° peeling strength is represented by force per unit width (N/mm).

When the copper foil composite has a three-layer structure including a plurality of bonding surfaces, the lowest value of the 180° peeling strength out of the bonding surfaces is used. This is because the weakest bonding surface is peeled. In addition, the copper foil generally has an S (Shine) surface and an M (Matte) surface. The S surface has poor bonding properties. So, the S surface of the copper foil is less bonded to the resin. Accordingly, the 180° peeling strength on the S surface of the copper foil is often used.

In order to increase the adhesion strength between the copper foil and the resin layer, a Cr oxide layer can be formed on the surface of the copper foil (on the surface of the resin layer) by a chromate treatment, the surface of the copper foil can be roughened, or the Cr oxide layer can be disposed after the surface of the copper foil is Ni coated.

The thickness of the Cr oxide layer may be 5 to 100 μg/dm² based on the weight of Cr. The thickness is calculated from the Cr content by wet analysis. The presence of the Cr oxide layer can be determined by X-ray photoelectron spectroscopy (XPS) for detecting Cr. (The peak of Cr is shifted by oxidation.)

The Ni coating amount may be 90 to 5000 μg/dm². If the Ni coating amount exceeds 5000 μg/dm² (which corresponds to the Ni thickness of 56 nm), the ductility of the copper foil (and the copper foil composite) may be decreased.

Furthermore, the adhesion strength can be increased by changing the pressure and the temperature conditions when the copper foil and the resin layer are laminated and combined. Insofar as the resin is not damaged, both of the pressure and the temperature upon lamination may be increased.

<$(f_3 \times t_3)/(f_2 \times t_2)$>

Next, the meaning of $((f_3 \times t_3)/(f_2 \times t_2))$ (hereinafter referred to as "equation 1") in the patent claims will be described. Since the copper foil composite comprises the copper foil and the resin layer laminated thereon, which have the same width (size), the equation 1 represents a ratio of the force applied to the copper foil to the force applied to the resin layer in the copper foil composite. When the ratio is 1 or more, much force is applied to the resin layer and the resin layer is stronger than the copper foil. As a result, the copper foil does not broken and exhibits good formability.

When $(f_3 \times t_3)/(f_2 \times t_2) < 1$, too much force is applied to the copper foil, and the above-mentioned effects do not provided, i.e., the deformation behavior of the resin layer is not transmitted to the copper foil, and the copper foil is not deformed together with the resin layer.

Here, $f_2$ and $f_3$ may be the stress at the same strain amount after plastic deformation. In consideration of the tensile breaking strain of the copper foil and the strain at the time of starting the plastic deformation of the resin layer (for example, PET film), the tensile strain of 4% is set. The values $f_2$ and $f_3$ (and $f_1$) are all obtained in a machine direction (MD).

<$33f_1/(F \times T)$>

Then, the meaning of $(33f_1/(F \times T)$ (hereinafter referred to as "equation 2") in patent claims will be described. As described above, the shear bond strength which directly shows the minimum adhesion strength between the copper foil and the resin layer required for increasing the formability is about 33 times greater than the 180° peeling strength $f_1$. In other words, $33f_1$ represents the minimum adhesion strength required for improving the formability of the copper foil and the resin layer. On the other hand, $(F \times T)$ is the strength of the copper foil composite, and the equation 2 represents a ratio of the adhesion strength between the copper foil and the resin layer to tensile force of the copper foil composite. When the copper foil composite is pulled, a shear stress is induced by the copper foil to be deformed locally and the resin to be subjected to uniform tensile strain at an interface between the copper foil and the resin layer. Accordingly, when the adhesion strength is lower than the shear stress, the copper and the resin layer are peeled. As a result, the deformation behavior of the resin layer cannot be transmitted to the copper foil, and the ductility of the copper foil is not improved.

In other words, when the ratio in the equation 2 is less than 1, the adhesion strength is lower than the force applied to the copper foil composite, and the copper foil and the resin tend to be easily peeled. Then, the copper foil may be broken by processing such as press forming.

When the ratio in the equation 2 is 1 or more, the copper and the resin layer are not peeled, and the deformation behavior of the resin layer can be transmitted to the copper foil, thereby improving the ductility of the copper foil. The higher ratio in the equation is preferred. However, it is generally difficult to provide the value of 10 or more. The upper limit in the equation 2 may be 10.

In addition, it is considered that the higher formability is, the higher the value of $33f_1/(F \times T)$ is. However, the tensile strain I of the resin layer is not proportional to $33f_1/(F \times T)$. This is because the effects of the magnitude of $(f_3 \times t_3)/(f_2 \times t_2)$ and the ductility of the copper foil or the rein layer alone. However, the combination of the copper foil and the resin layer which satisfying the equations: $33f_1/(F \times T) \geq 1$ and $(f_3 \times t_3)/(f_2 \times t_2) \geq 1$ can provide the composite having the required formability.

Here, the reason for using the strength obtained when the tensile strain is 30% as the strength F of the copper foil composite is that the formability was excellent when the tensile strain exceeded 30% or more, as described above. Another reason is as follows: When the copper foil composite was subjected to a tensile test, a great difference was produced in the flow stress due to the strain until the tensile strain reached 30%. However, no great difference was produced in the flow stress due to the strain after the tensile strain reached 30% (although the copper foil composite was somewhat work hardened, the slope of the curve became gentle).

When the tensile strain of the copper foil composite is less than 30%, the tensile strength of the copper foil composite is defined as F.

As described above, the copper foil composite of the present invention has excellent formability while preventing a copper foil from broken even if a severe (complex) deformation, which is different from a uniaxial flex, is made by press forming and the like. In particular, the present invention is suitable for three-dimensional molding such as press forming. When the copper foil composite is three-dimensional formed, the copper foil composite can have a complex shape and improved strength. For example, the copper foil composite itself can be a housing used in various power circuits, resulting in decreased the number of parts and costs.

<I/L>

The ratio I/L of tensile breaking strain I of the copper foil composite and tensile breaking strain L of the resin layer alone is preferably 0.7 to 1.

In general, the tensile breaking strain of the resin layer is significantly higher than that of the copper foil composite. Especially, the tensile breaking strain of the resin layer alone is significantly higher than that of the copper foil composite. On the other hand, according to the present invention, the deformation behavior of the resin layer is transmitted to the copper foil, so that the ductility of the copper foil is improved, as described above. The tensile breaking strain of the copper foil composite can be correspondingly enhanced to 70 to 100% of the tensile breaking strain of the resin layer alone. When the ratio I/L is 0.7 or more, the press formability can be further improved.

The tensile breaking strain I of the copper foil composite is the tensile breaking strain obtained by the tensile test. And, when both the resin layer and the copper foil are broken at the same time, the value of this point is defined as I. When the copper foil is broken first, the value when the copper foil is broken is defined as I. The tensile breaking strain L of the resin layer alone is obtained as follows: When the resin layers are disposed on both surfaces of the copper foil, the tensile test is conducted on each resin layer to measure the tensile breaking strain. The greater tensile breaking strain is defined as L. When the resin layers are disposed on both surfaces of the copper foil, each of two resin layers obtained by removing the copper foil is thus measured.

<Tg of the Resin Layer>

Typically, the resin layer has decreased strength and adhesion strength at high temperature. So, it is difficult to satisfy $(f_3 \times t_3)/(f_2 \times t_2) \geq 1$ and $1 \leq 33 f_1/(F \times T)$ at high temperature. Specifically, at the glass transition temperature (Tg) or more of the resin layer, the strength and the adhesion strength of the resin layer may be difficult to be kept. At the temperature lower than Tg, the strength and the adhesion strength of the resin layer tend to be easily kept. In other words, at the temperature lower than the glass transition temperature (Tg) (e.g. 5° C. to 215° C.) of the resin layer, the copper foil composite easily satisfies $(f_3 \times t_3)/(f_2 \times t_2) \geq 1$ and $1 \leq 33 f_1/(F \times T)$. However, at the higher temperature but lower than Tg, the strength and the adhesion strength of the resin layer are decreased and satisfying the equations 1 and 2 tends to be difficult (see Examples 20 to 22 described later).

When the equations 1 and 2 are satisfied, it is found that the ductility of the copper foil composite can be maintained even at relatively high temperature (e.g., 40° C. to 215° C.) lower than Tg of the resin layer. If the ductility of the copper foil composite can be maintained even at relatively high temperature (e.g., 40° C. to 215° C.) but lower than Tg of the resin layer, excellent formability is shown even in a warm press forming. It is preferred that the temperature be higher so that the resin layer is provided with the good formability. The copper foil composite is warm pressed to retain the shape after pressing (not to return to the original shape caused by elastic deformation). From this point of view, it is preferred that the ductility of the copper foil composite can be maintained at relatively high temperature (e.g., 40° C. to 215° C.) but lower than Tg of the resin layer.

If the copper foil composite comprises the adhesive agent layer and the resin layer, or if there are a plurality of resin layers as the copper foil composite having the three-layer structure, the lowest glass transition temperature (Tg) of the resin layer is used.

EXAMPLE

Production of the Copper Foil Composite

A tough-pitch copper ingot was hot-rolled, was surface-cut to remove oxides, was cold-rolled, was annealed and acid-pickled repeatedly to reduce the thickness untill $t_2$ (mm) as shown in Table 1, and was finally annealed to ensure the formability, and was rust-proofed using benzotriazole, whereby each copper foil was provided. A tension upon cold-rolling and rolling conditions of the rolled material in a width direction were uniform so that the copper foil had uniform texture in the width direction. In the next annealing, a plurality of heaters was used to control the temperature so that a uniform temperature distribution was attained in the width direction, and the temperature of the copper was measured and controlled.

Furthermore, the resultant copper foil was surface-treated as shown in Table 1. Thereafter, each resin film (resin layer) shown in Table 1 was laminated thereon by vacuum pressing (pressing pressure of 200 N/cm$^2$) at a temperature of (Tg of the resin layer+50° C.) or more to produce each copper foil composite having each layer structure shown in Table 1. When the resin films were laminated on both surfaces of the copper foil, $f_1$ was measured for both surfaces. The smaller $f_1$ (having low adhesion strength) obtained on the surface-treated cooper foil was reported in Table 1.

In Table 1, Cu represents a copper foil, PI represents a polyimide film, and PET represents a polyethylene terephtalate film. Tgs of PI and PET were 220° C. and 70° C.

The conditions of the surface treatment were as follows:

Chromate treatment: a chromate bath ($K_2Cr_2O_7$: 0.5 to 5 g/L) was used, and electrolytic treatment was conducted at current density of 1 to 10 A/dm$^2$.

Ni coating+chromate treatment: a Ni plating bath (Ni ion concentration: 1 to 30 g/L Watts bath) was used, Ni plating was conducted at a plating bath temperature of 25 to 60° C. and at current density of 0.5 to 10 A/dm$^2$, and the chromate treatment was then conducted as described above.

Roughening treatment: a treatment liquid (Cu: 10 to 25 g/L, $H_2SO_4$: 20 to 100 g/L) was used, and electrolytic treatment was conducted at a temperature of 20 to 40° C. and at current density of 30 to 70 A/dm$^2$ for 1 to 5 seconds. Thereafter, a Ni—Co plating liquid (Co ion concentration: 5 to 20 g/L, Ni ion concentration: 5 to 20 g/L, pH: 1.0 to 4.0) was used to conduct Ni—Co plating at a temperature of 25 to 60° C. and at current density of 0.5 to 10 N dm$^2$.

<Tensile Test>

A plurality of strip test specimens each having a width of 12.7 mm were produced from the copper foil composite. As to the copper foil and the resin film of the tensile test, 12.7 mm wide strip test specimens were produced from the copper foil alone and the resin film alone before lamination.

Using a tensile tester, the tensile test was conducted in a direction parallel to the rolling direction of the copper foil in accordance with JIS-Z2241. The test temperature upon each tensile test is shown in Table 1.

<180° Peel Test>

A 180° peel test was conducted to measure the 180° peeling strength $f_1$. A plurality of peel test specimens each having a width of 12.7 mm were produced from the copper foil composite. The copper foil surface of the test specimen was fixed on a SUS plate, and the resin layer was peeled in a direction at an angle of 180°. In Examples where the resin layers were disposed on both surfaces of the copper foil, the resin layer+the copper foil were fixed on the SUS plate, and the opposite resin layer was peeled in a direction at an angle of 180°. In Examples where the copper foils were disposed on both surfaces of the resin layer, the copper foil at one surface was removed and the copper foil on the opposite surface was fixed on the SUS plate, and the resin layer was peeled in a direction at angle of 180°. The other conditions were in accordance with JIS-05016.

Although the copper foil layer was peeled in accordance with JIS standard, the resin layer was peeled in Examples in order to minimize the effects of the thickness and the stiffness of the copper foil.

<Evaluation of Formability>

Figure 2:
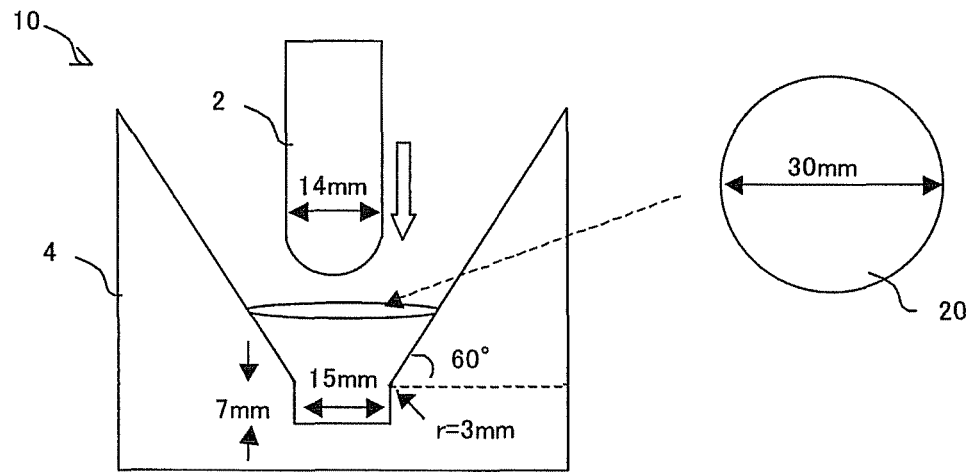
FIG. 2 shows a schematic configuration of a cup test device for evaluating the formability.

The formability was evaluated using a cup test device 10 shown in FIG. 2. The cup test device 10 comprised a die 4 and a punch 2. The die 4 had a frustum slope. The frustum was tapered from up to down. The frustum slope was tilted at an angle of 60° from a horizontal surface. The bottom of the frustum was communicated with a circular hole having a diameter of 15 mm and a depth of 7 mm. The punch 2 was a cylinder and had a tip in a semispherical shape with a diameter of 14 mm. The semispherical tip of the punch 2 could be inserted into the circular hole of the frustum.

A connection part of the tapered tip of the frustum and the circular hole at the bottom of the frustum was rounded by a radius (r)=3 mm.

The copper foil composite was punched out to provide the test specimen 20 in a circular plate shape with a diameter of 30 mm, and was disposed on the slope of the frustum of the pedestal 4. The punch 2 was pushed down on the top of the test specimen 20 to insert it into the circular hole of the pedestal 4. Thus, the test specimen 20 was formed in a conical cup shape.

In the case the resin layer was disposed on one surface of the copper foil composite, the copper foil composite was disposed on the pedestal 4 such that the resin layer was faced upward. In the case the resin layers were disposed on both surfaces of the copper foil composite, the copper foil composite was disposed on the pedestal 4 such that the resin layer bonded to the M surface was faced upward. In the case the both surfaces of the copper foil composite was Cu, either surface might be faced upward.

After molding, the crack of the copper foil in the test specimen 20 was visually identified. The formability was evaluated the following scales:

Excellent: the copper foil was not cracked and had no wrinkles.

Good: the copper foil was not cracked but had some wrinkles.

Not Good: the copper foil was cracked.

The results are shown in Tables 1 and 2. The test temperatures in Table 1 show the temperatures for obtaining F, $f_1$, $f_2$, $f_3$ and the formability.

TABLE 1

| | Surface treatment of copper foil | Pressing pressure upon lamination (N/cm2) | Structure of copper foil composite | Tg of resin layer (° C.) | Test temperature (° C.) | F (MPa) | T (mm) | f1 (N/mm) | f2 (MPa) | t2 (mm) | f3 (MPa) | t3 (mm) |
|---|---|---|---|---|---|---|---|---|---|---|---|---|
| Example 1 | Roughening | 200 | Cu/PI | 220 | 25 | 188 | 0.039 | 1.83 | 145 | 0.007 | 145 | 0.032 |
| Example 2 | Roughening | 200 | Cu/PI | 220 | 25 | 179 | 0.044 | 1.86 | 125 | 0.012 | 145 | 0.032 |
| Example 3 | Roughening | 200 | Cu/PI | 220 | 25 | 147 | 0.068 | 1.88 | 128 | 0.018 | 100 | 0.050 |
| Example 4 | Roughening | 200 | Cu/PI | 220 | 25 | 180 | 0.087 | 2.15 | 121 | 0.035 | 137 | 0.052 |
| Example 5 | Chromate | 200 | PI/Cu/PI | 220 | 25 | 125 | 0.057 | 1.01 | 145 | 0.007 | 100 | 0.050 |
| Example 6 | Chromate | 200 | PI/Cu/PI | 220 | 25 | 135 | 0.062 | 1.01 | 125 | 0.012 | 100 | 0.050 |
| Example 7 | Chromate | 200 | PI/Cu/PI | 220 | 25 | 135 | 0.118 | 1.01 | 128 | 0.018 | 100 | 0.100 |
| Example 8 | Chromate | 200 | PI/Cu/PI | 220 | 25 | 142 | 0.135 | 1.01 | 94 | 0.035 | 100 | 0.100 |
| Example 9 | Chromate | 200 | PI/Cu/PI | 220 | 25 | 148 | 0.135 | 1.01 | 121 | 0.035 | 100 | 0.100 |
| Example 10 | Chromate | 200 | PI/Cu/PI | 220 | 25 | 150 | 0.135 | 1.01 | 143 | 0.035 | 100 | 0.100 |
| Example 11 | Ni Coating + Chromate | 200 | PI/Cu/PI | 220 | 25 | 148 | 0.135 | 1.57 | 121 | 0.035 | 100 | 0.100 |
| Example 12 | Roughening | 200 | PI/Cu/PI | 220 | 25 | 145 | 0.135 | 2.15 | 94 | 0.035 | 100 | 0.100 |
| Example 13 | Roughening | 200 | PI/Cu/PI | 220 | 25 | 158 | 0.135 | 2.15 | 121 | 0.035 | 100 | 0.100 |
| Example 14 | Roughening | 200 | PI/Cu/PI | 220 | 25 | 160 | 0.135 | 2.15 | 143 | 0.035 | 100 | 0.100 |
| Example 15 | Chromate | 200 | PI/Cu/PI | 220 | 25 | 135 | 0.135 | 1.01 | 80 | 0.035 | 100 | 0.100 |
| Example 16 | Roughening | 200 | PET/Cu/PET | 70 | 25 | 105 | 0.107 | 0.64 | 145 | 0.007 | 85 | 0.100 |
| Example 17 | Roughening | 200 | Cu/PI/Cu | 220 | 25 | 158 | 0.264 | 1.85 | 145 | 0.014 | 100 | 0.250 |
| Example 18 | Chromate | 200 | PI/Cu/PI | 220 | 25 | 146 | 0.135 | 0.60 | 121 | 0.035 | 100 | 0.100 |
| Example 19 | Chromate | 200 | PI/Cu/PI | 220 | 25 | 142 | 0.21 | 1.01 | 121 | 0.035 | 100 | 0.175 |
| Example 20 | Same as Exmple 6 | | | | 200 | 75 | 0.135 | 0.50 | 111 | 0.035 | 43 | 0.100 |
| Example 21 | Same as Example 12 | | | | 200 | 75 | 0.135 | 0.80 | 111 | 0.035 | 43 | 0.100 |
| Example 22 | Same as Exmple 6 | | | | 150 | 130 | 0.135 | 0.80 | 120 | 0.035 | 90 | 0.100 |
| Comparative Example 1 | — | 200 | Cu/PI | 220 | 25 | 158 | 0.087 | 0.20 | 121 | 0.035 | 137 | 0.052 |
| Comparative Example 2 | Chromate | 100 | PI/Cu/PI | 220 | 25 | 139 | 0.135 | 0.40 | 121 | 0.035 | 100 | 0.100 |
| Comparative Example 3 | Chromate | 200 | PI/Cu/PI | 220 | 25 | 120 | 0.085 | 1.01 | 143 | 0.035 | 87 | 0.050 |
| Comparative Example 4 | Roughening | 200 | PET/Cu/PET | 70 | 25 | 98 | 0.107 | 0.30 | 145 | 0.007 | 80 | 0.100 |
| Comparative Example 5 | Chromate | 100 | PI/Cu/PI | 220 | 25 | 70 | 0.135 | 0.20 | 111 | 0.035 | 43 | 0.100 |

TABLE 2

| | Structure | 33*f1/(F × T) | (f3 × t3)/(f2 × t2) | L | I | I/L | Formability |
|---|---|---|---|---|---|---|---|
| Example 1 | Cu/PI | 8.24 | 4.57 | 50 | 34 | 0.68 | Good |
| Example 2 | Cu/PI | 7.79 | 3.09 | 50 | 33 | 0.66 | Good |
| Example 3 | Cu/PI | 6.21 | 2.17 | 107 | 35 | 0.33 | Good |
| Example 4 | Cu/PI | 4.53 | 1.68 | 68 | 45 | 0.66 | Good |
| Example 5 | PI/Cu/PI | 4.68 | 4.93 | 107 | 53 | 0.50 | Good |
| Example 6 | PI/Cu/PI | 3.98 | 3.33 | 107 | 48 | 0.45 | Good |
| Example 7 | PI/Cu/PI | 2.09 | 4.34 | 107 | 45 | 0.42 | Good |
| Example 8 | PI/Cu/PI | 1.74 | 3.04 | 107 | 105 | 0.98 | Excellent |
| Example 9 | PI/Cu/PI | 1.67 | 2.36 | 107 | 47 | 0.44 | Good |
| Example 10 | PI/Cu/PI | 1.67 | 2.00 | 107 | 38 | 0.36 | Good |
| Example 11 | PI/Cu/PI | 2.59 | 2.36 | 107 | 58 | 0.54 | Good |
| Example 12 | PI/Cu/PI | 3.62 | 3.04 | 107 | 105 | 0.98 | Excellent |
| Example 13 | PI/Cu/PI | 3.33 | 2.36 | 107 | 75 | 0.70 | Excellent |
| Example 14 | PI/Cu/PI | 3.28 | 2.00 | 107 | 60 | 0.56 | Good |
| Example 15 | PI/Cu/PI | 1.83 | 3.57 | 107 | 105 | 0.98 | Excellent |
| Example 16 | PET/Cu/PET | 1.88 | 8.37 | 83 | 57 | 0.69 | Good |
| Example 17 | Cu/PI/Cu | 1.46 | 12.32 | 107 | 45 | 0.42 | Good |
| Example 18 | PI/Cu/PI | 1.00 | 2.36 | 107 | 30 | 0.28 | Good |
| Example 19 | PI/Cu/PI | 1.12 | 4.13 | 107 | 32 | 0.30 | Good |
| Example 20 | PI/Cu/PI | 1.63 | 1.11 | 150 | 70 | 0.47 | Good |
| Example 21 | PI/Cu/PI | 2.61 | 1.11 | 150 | 78 | 0.52 | Good |

TABLE 2-continued

|  | Structure | 33*f1/(F × T) | (f3 × t3)/(f2 × t2) | L | I | I/L | Formability |
| --- | --- | --- | --- | --- | --- | --- | --- |
| Example 22 | PI/Cu/PI | 1.50 | 2.14 | 114 | 78 | 0.68 | Good |
| Comparative Example 1 | Cu/PI | 0.48 | 1.68 | 68 | 14 | 0.21 | Not Good |
| Comparative Example 2 | PI/Cu/PI | 0.70 | 2.36 | 107 | 11 | 0.10 | Not Good |
| Comparative Example 3 | PI/Cu/PI | 3.27 | 0.87 | 107 | 19 | 0.18 | Not Good |
| Comparative Example 4 | PI/Cu/PI | 0.94 | 7.88 | 80 | 20 | 0.25 | Not Good |
| Comparative Example 5 | PI/Cu/PI | 0.70 | 1.11 | 150 | 8 | 0.05 | Not Good |

As apparent from Tables 1 and 2, in each Example, both $(f_3 \times t_3)/(f_2 \times t_2) \geq 1$ and $1 \leq 33f_1/(F \times T)$ were satisfied, and the formability was excellent.

When Example 6 was compared with Example 20 each having the same structure of the copper foil laminate, the value of $(f_3 \times t_3)/(f_2 \times t_2)$ in Example 6 was greater than that in Example 20. In Example 6, F and so on were measured by conducting the tensile test at room temperature (about 25° C.). It can be concluded that the resin layer in Example 20 was weak (i.e., $f_3$ is small) due to high test temperature.

On the other hand, in Comparative Example 1 where the resin film was laminated without conducting the surface treatment of the copper foil, the adhesion strength was decreased, $33f_1/(F \times T)$ was less than 1, and the formability was poor.

In Comparative Examples 2 and 5 where the pressing pressure upon lamination was decreased to 100 N/cm², the adhesion strength was decreased, $33f_1/(F \times T)$ was less than 1, and the formability was poor.

In Comparative Example 3 where the thickness of the resin film was decreased, the strength of the resin film was decreased as compared with the copper foil and $(f_3 \times t_3)/(f_2 \times t_2)$ was less than 1, and the formability was poor.

In Comparative Example 4 where the resin film and the copper foil were not heat-sealed, and were laminated using an adhesive agent, the adhesion strength was decreased, $33f_1/(F \times T)$ was less than 1, and the formability was poor.

What is claimed is:

1. A copper foil composite comprising a rolled copper foil and a resin layer laminated thereon as a three-layer structure of the resin layer/the copper foil/the resin layer or the copper foil/the resin layer/the copper foil, wherein equation 1: $(f_3 \times t_3)/(f_2 \times t_2) \geq 1$ is satisfied when $t_2$ (mm) is a thickness of the copper foil, $f_2$ (MPa) is a stress of the copper foil under tensile strain of 4% upon a tensile test in a direction parallel to the rolling direction of the copper foil in accordance with JIS-Z2241, $t_3$ (mm) is a thickness of the resin layer, $f_3$ (MPa) is a stress of the resin layer under tensile strain of 4% upon a tensile test in a machine direction (MD) in accordance with JIS-Z2241, and equation 2: $1 \leq 33f_1/(F \times T)$ is satisfied when $f_1$ (N/mm) is 180° peeling strength between the copper foil and the resin layer in accordance with JIS-05016 except that a copper foil surface of the composite is fixed on a SUS plate, and the resin layer is peeled in a direction at an angle of 180° instead of the copper foil layer being peeled in accordance with JIS-05016, wherein a test specimen of the composite has a width of 12.7 mm, F (MPa) is a stress of the copper foil composite under tensile strain of 30% upon a tensile test in a machine direction (MD) in accordance with JIS-Z2241, and T (mm) is a thickness of the copper foil composite, wherein the equations 1 and 2 are true at a temperature of 25° C. or more and lower than the glass transition temperature of the resin layer.

2. The copper foil composite according to claim 1, wherein the resin layer comprises a polyimide or a polyethylene terephthalate.

3. The copper foil composite according to claim 1, wherein the resin layer comprises a polyimide.

4. A molded product which is shaped by forming the copper foil composite according to claim 1.

5. The copper foil composite according to claim 1, wherein a ratio I/L of tensile breaking strain I of the copper foil composite to tensile breaking strain L of the resin layer alone is 0.7 to 1, wherein I and L are each obtained by the tensile test.

6. A molded product which is shaped by forming the copper foil composite according to claim 5.

7. A method for manufacturing a molded product comprising the step of forming the copper foil composite according to claim 1.

8. A method for manufacturing a molded product comprising the step of forming the copper foil composite according to claim 5.

* * * * *